United States Patent
Yang et al.

(10) Patent No.: US 10,122,354 B2
(45) Date of Patent: Nov. 6, 2018

(54) MULTI-CHANNEL CLOCK DISTRIBUTION CIRCUIT AND ELECTRONIC DEVICE

(71) Applicant: Huawei Technologies Co., Ltd., Shenzhen (CN)

(72) Inventors: Jinda Yang, Shanghai (CN); Liren Zhou, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/700,916

(22) Filed: Sep. 11, 2017

(65) Prior Publication Data

US 2018/0076804 A1 Mar. 15, 2018

(30) Foreign Application Priority Data

Sep. 13, 2016 (CN) .......................... 2016 1 0822650

(51) Int. Cl.
*H03K 5/15* (2006.01)
*H03K 5/00* (2006.01)

(52) U.S. Cl.
CPC . *H03K 5/1508* (2013.01); *H03K 2005/00286* (2013.01)

(58) Field of Classification Search
CPC ....................................................... H03K 5/15
See application file for complete search history.

(56) References Cited

U.S. PATENT DOCUMENTS

| 6,069,498 | A | 5/2000 | Noll et al. | |
|---|---|---|---|---|
| 9,503,066 | B2 * | 11/2016 | Ma | ........................ H03K 5/1565 |
| 2001/0000952 | A1 | 5/2001 | Saeki | |
| 2011/0241746 | A1 | 10/2011 | Fu | |

FOREIGN PATENT DOCUMENTS

| CN | 1239356 A | 12/1999 |
|---|---|---|
| CN | 202424651 U | 9/2012 |
| CN | 103023461 A | 4/2013 |
| CN | 105431861 A | 3/2016 |
| WO | 2014193496 A1 | 12/2014 |

OTHER PUBLICATIONS

Machine Translation and Abstract of Chinese Publication No. CN202424651, dated Sep. 5, 2012, 13 pages.
Machine Translation and Abstract of Chinese Publication No. CN103023461, dated Apr. 3, 2013, 13 pages.
Foreign Communication From A Counterpart Application, Chinese Application No. 201610822650.3, Chinese Office Action dated Aug. 31, 2018, 6 pages.

* cited by examiner

*Primary Examiner* — Hai L Nguyen
(74) *Attorney, Agent, or Firm* — Conley Rose, P.C.

(57) ABSTRACT

A multi-channel clock distribution circuit and an electronic device includes a power source, a first switch, and at least two clock distribution sub-circuits; each clock distribution sub-circuit includes a second switch, a third switch, and a capacitor; a first end of the capacitor is connected to the power source by using the second switch and is connected to the first end of the first switch by using the third switch, a second end of the capacitor is grounded, and the first end of the capacitor is used as an output end of the clock distribution sub-circuits; and connection and disconnection of the first switch is controlled by a first clock signal, connection and disconnection of the second switch is controlled by a second clock signal, and connection and disconnection of the third switch is controlled by a third clock signal.

11 Claims, 2 Drawing Sheets

MULTI-CHANNEL CLOCK DISTRIBUTION CIRCUIT AND ELECTRONIC DEVICE

CROSS-REFERENCE TO RELATED APPLICATION

This non-provisional application claims priority to Chinese Patent Application No. 201610822650.3, filed on Sep. 13, 2016, which is hereby incorporated by reference in its entirety.

TECHNICAL FIELD

The disclosure relates to the circuit field, and in particular, to a multi-channel clock distribution circuit and an electronic device.

BACKGROUND

In an analog to digital converter or a phase-locked loop, one channel of high-speed clock usually needs to be distributed into multiple channels of low-speed parallel clocks. In addition, for these parallel clocks, a relatively precise phase relationship between neighboring clocks needs to be ensured. Otherwise, for a time-interleaved analog to digital converter, when phases between neighboring clocks do not match, a high-frequency input signal may bring clock and signal related harmonics to a frequency spectrum, thereby affecting conversion precision. Precision or a speed of a conventional time-interleaved analog to digital converter usually cannot reach a certain degree. Therefore, a phase matching problem of parallel clocks is not manifest. As the speed and the precision continuously improve, the phase matching problem of parallel clocks becomes severer.

A conventional multi-channel clock distribution circuit is usually implemented by connecting D flip-flops in series. Each channel of clock passes through different D flip-flops and output drives. Therefore, a clock phase mismatch between different channels generally reaches a picosecond level. A main reason why the relatively large mismatch is caused is that the clock passes through a logic gate. An output transition point of the logic gate is directly determined by threshold voltages of a P-channel Metal-Oxide Semiconductor (PMOS) transistor and an N-channel Metal-Oxide Semiconductor (NMOS) transistor. A mismatch between threshold voltages directly causes a relatively large clock phase deviation between different channels. Therefore, a phase matching degree between channels of clocks is relatively low.

SUMMARY

The disclosure provides a multi-channel clock distribution circuit and an electronic device, so as to improve a phase matching degree between channels of clocks in a multi-channel clock.

A first aspect of the disclosure provides a multi-channel clock distribution circuit. The multi-channel clock distribution circuit includes a power source, a first switch, and at least two clock distribution sub-circuits, and structures and functions of the clock distribution sub-circuits are the same; a first end of each of the clock distribution sub-circuits is connected to the power source, and a second end of each of the clock distribution sub-circuits is connected to a first end of the first switch, that is, the clock distribution sub-circuits are connected in parallel between the power source and the first switch; and a second end of the first switch is grounded.

Each of the clock distribution sub-circuits includes a second switch, a third switch, and a capacitor.

A first end of the capacitor is connected to the power source by using the second switch and is connected to the first end of the first switch by using the third switch, that is, the first end of the capacitor is connected between the second switch and the third switch; a second end of the capacitor is grounded; and the first end of the capacitor is used as an output end of the clock distribution sub-circuit.

Connection and disconnection of the first switch is controlled by a first clock signal, connection and disconnection of the second switch is controlled by a second clock signal, and connection and disconnection of the third switch is controlled by a third clock signal. The first clock signal, the second clock signal, and the third signal may be periodic square wave signals.

In the multi-channel clock distribution circuit provided in the disclosure, an edge of an output end Voltage$_{out}$ ($V_{out}$) of each of the clock distribution sub-circuits is directly provided by clocks of a same source. That is, a falling edge of the output end $V_{out}$ of each of the clock distribution sub-circuits is determined by a rising edge of the first clock signal. In this way, the falling edges of the output ends $V_{out}$ of the clock distribution sub-circuits are synchronous, thereby improving a phase matching degree between channels of clocks in a multi-channel clock.

With reference to the first aspect of the disclosure, in a first implementation of the first aspect, the first switch, the second switch, and the third switch are all metal oxide semiconductor (MOS) transistors. Functions of the switches in the disclosure are implemented by using characteristics of the MOS transistors and connection and disconnection functions of the MOS transistors.

With reference to the first implementation of the first aspect of the disclosure, in a second implementation of the first aspect, the second switch includes a first PMOS transistor, the first switch includes a first NMOS transistor, and the third switch includes a second NMOS transistor.

In this implementation, a specific connection relationship is as follows. A source of the first PMOS transistor is connected to the power source, a drain of the first PMOS transistor is connected to a drain of the second NMOS transistor, and a source of the second NMOS transistor is connected to a drain of the first NMOS transistor; and a gate of the first PMOS transistor, a gate of the first NMOS transistor, and a gate of the second NMOS transistor are all externally connected to a control signal generation circuit, and the control signal generation circuit is configured to generate a clock signal.

As the output end of the clock distribution sub-circuit, the first end of the capacitor is connected to the drain of the first PMOS transistor and the drain of the second NMOS transistor.

In this implementation, a specific PMOS transistor and a specific NMOS transistor are used together, to achieve corresponding functions and effects of the switches in the disclosure.

With reference to the first aspect of the disclosure, in a third implementation of the first aspect, the first switch, the second switch, and the third switch are all transistors. Similar to the MOS transistors, corresponding functions and effects of the switches provided in the disclosure can also be achieved by using transistors.

With reference to the first aspect of the disclosure, in a fourth implementation of the first aspect, the first switch, the second switch, and the third switch are all complementary metal oxide semiconductor (CMOS) transmission gates. The CMOS transmission gates also have connection and disconnection functions. Corresponding functions and effects of the switches provided in the disclosure can also be achieved by controlling connection and disconnection of the CMOS transmission gates by using a clock signal.

With reference to any one of the first aspect of the disclosure or the first to the fourth implementations of the first aspect, in a fifth implementation of the first aspect, the first switch is connected when the first clock signal is a first level signal and is disconnected when the first clock signal is a second level signal, the second switch is connected when the second clock signal is a third level signal and is disconnected when the second clock signal is a fourth level signal, and the third switch is connected when the third clock signal is a fifth level signal and is disconnected when the third clock signal is a sixth level signal. The connection and disconnection of the switches are controlled by using the level signals output by the clock signals. For example, the first level signal may be at a high level, and the corresponding second level signal may be at a low level.

With reference to the fifth implementation of the first aspect of the disclosure, in a sixth implementation of the first aspect, the first switch and the third switch cannot simultaneously stay in a connected state from a start moment from which the second clock signal is the first level signal to an end moment till which the second clock signal is the first level signal. That is, in a period in which the second switch stays in a connected state, when the first switch stays in a connected state, the third switch stays in a disconnected state; or when the first switch stays in a disconnected state, the third switch stays in a connected or disconnected state.

With reference to the sixth implementation of the first aspect of the disclosure, in a seventh implementation of the first aspect, from the start moment from which the second clock signal is the first level signal to the end moment till which the second clock signal is the first level signal, switchover of the first clock signal from the third level signal to the fourth level signal occurs and is completed at least once, and switchover of the third clock signal from the sixth level signal to the fifth level signal occurs and is completed only once. That is, in the period in which the second switch stays in a connected state, switchover of the first switch from connected to disconnected occurs and is completed at least once, and switchover of the third switch from disconnected to connected occurs and is completed only once. In addition, in this period, the first switch and the third switch cannot simultaneously stay in a connected state, that is, a connection time period of the first switch does not overlap with a connection time period of the third switch.

With reference to the fifth implementation of the first aspect of the disclosure, in an eighth implementation of the first aspect, from a start moment from which the second clock signal is the second level signal to an end moment till which the second clock signal is the second level signal, switchover of the first clock signal from the fourth level signal to the third level signal occurs and is completed at least once, and switchover of the third clock signal from the fifth level signal to the sixth level signal occurs and is completed only once. That is, in a period in which the second switch stays in a disconnected state, switchover of the first switch from disconnected to connected occurs and is completed at least once, and switchover of the third switch from connected to disconnected occurs and is completed only once. In this period, a connection time period of the first switch partially overlaps with a connection time period of the third switch.

A second aspect of the disclosure provides an electronic device, and the electronic device includes the multi-channel clock distribution circuit according to any implementation of the first aspect or implementations of the first aspect.

DESCRIPTION OF EMBODIMENTS

To make persons skilled in the art understand the solutions in this application better, the following clearly describes the technical solutions in the embodiments of this application with reference to the accompanying drawings in the embodiments of this application. The described embodiments are merely a part rather than all of the embodiments of this application. All other embodiments obtained by persons of ordinary skill in the art based on the embodiments of this application without creative efforts shall fall within the protection scope of this application.

In the specification, claims, and accompanying drawings of this application, the terms "first", "second", and so on (if they exist) are intended to distinguish between similar objects but do not necessarily indicate a specific order or sequence. It should be understood that the data termed in such a way are interchangeable in proper circumstances so that the embodiments described herein can be implemented in other orders than the order illustrated or described herein. Moreover, the terms "include", "contain" and any other variants mean to cover the non-exclusive inclusion, for example, a process, method, system, product, or device that includes a list of steps or units is not necessarily limited to those steps or units, but may include other steps or units not expressly listed or inherent to such a process, method, system, product, or device.

This application provides a new concept that clocks of a same source are used to provide unified timing for multiple channels, and each channel selects proper timing for the channel by using a gating switch. This ensures, in structure and in principle, that a phase deviation between channels of clocks in a multi-channel clock is controlled within a proper range.

Figure 1:
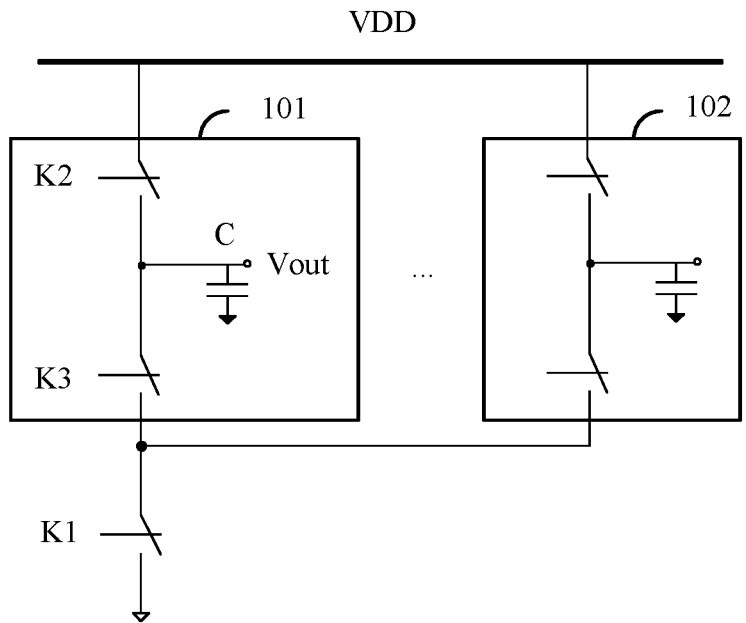
FIG. 1 is a schematic organizational structure diagram of a multi-channel clock distribution circuit according to this application.

This application provides a multi-channel clock distribution circuit. As shown in FIG. 1, the multi-channel clock distribution circuit includes a power source voltage VDD, a first switch K1, and at least two clock distribution sub-circuits. Structures and functions of the clock distribution sub-circuits are consistent, and connection relationships within the clock distribution sub-circuits and connection relationships between the clock distribution sub-circuits and each of the power source voltage VDD and the first switch K1 are also consistent. For example, in FIG. 1, structures, functions, connection relationships, and the like of a first clock distribution sub-circuit 101 and a second clock distribution sub-circuit 102 are all consistent.

The first clock distribution sub-circuit 101 in FIG. 1 is used as an example for description. For another clock distribution sub-circuit, refer to corresponding related descriptions of the first clock distribution sub-circuit 101 to facilitate understanding. In FIG. 1, a first end of the first clock distribution sub-circuit 101 is connected to the power source voltage VDD, and a second end of the first clock distribution sub-circuit 101 is connected to a first end of the first switch K1. With reference to a connection relationship of the first clock distribution sub-circuit 101, when there are multiple clock distribution sub-circuits, the clock distribution sub-circuits are connected in parallel between the power source voltage VDD and the first switch K1. A second end of the first switch K1 is grounded.

In FIG. 1, the first clock distribution sub-circuit 101 includes the following structures. A second switch K2, a third switch K3, and a capacitor C.

A first end of the capacitor C is connected to the power source voltage VDD by using the second switch K2 and is connected to the first end of the first switch K1 by using the third switch K3, that is, the first end of the capacitor C is connected between the second switch K2 and the third switch K3. A second end of the capacitor C is grounded. The first end of the capacitor C may be used as an output end $V_{out}$ of the clock distribution sub-circuit.

It should be noted that, connection and disconnection of the first switch K1 is controlled by a first clock signal, connection and disconnection of the second switch K2 is controlled by a second clock signal, and connection and disconnection of the third switch K3 is controlled by a third clock signal. The first clock signal, the second clock signal, and the third signal may be periodic square wave signals.

In the solutions of the disclosure, an edge of an output end $V_{out}$ of each clock distribution sub-circuit is directly provided by clocks of a same source. That is, a falling edge of the output end $V_{out}$ of each clock distribution sub-circuit is determined by a rising edge of the first clock signal. In this way, the falling edges of the output end $V_{out}$ of the clock distribution sub-circuits are synchronous, thereby improving a phase matching degree between channels of clocks in a multi-channel clock.

Optionally, the first switch K1 is connected when the first clock signal is a first level signal and is disconnected when the first clock signal is a second level signal, the second switch K2 is connected when the second clock signal is a third level signal and is disconnected when the second clock signal is a fourth level signal, and the third switch K3 is connected when the third clock signal is a fifth level signal and is disconnected when the third clock signal is a sixth level signal. For example, when the first clock signal is at a high level 1, the first switch K1 is connected; or when the first clock signal is at a low level 0, the first switch K1 is connected. This is not specifically limited herein. Similarly, disconnection and connection manners for the second switch K2 and the third switch K3 are not limited herein either.

Optionally, the first switch K1 and the third switch K3 cannot simultaneously stay in a connected state from a start moment from which the second clock signal is the first level signal to an end moment till which the second clock signal is the first level signal. It should be noted that, from the start moment from which the second clock signal is the first level signal to the end moment till which the second clock signal is the first level signal, that is, in a period in which the second switch K2 stays in a connected state, the first switch K1 and the third switch K3 cannot simultaneously stay in a connected state. That is, in a period in which the second switch K2 stays in a connected state, when the first switch K1 stays in a connected state, the third switch K3 stays in a disconnected state; or when the first switch K1 stays in a disconnected state, the third switch K3 stays in a connected or disconnected state.

Specifically, from the start moment from which the second clock signal is the first level signal to the end moment till which the second clock signal is the first level signal, switchover of the first clock signal from the third level signal to the fourth level signal occurs and is completed at least once, and switchover of the third clock signal from the sixth level signal to the fifth level signal occurs and is completed only once. That is, in the period in which the second switch K2 stays in a connected state, switchover of the first switch K1 from connected to disconnected occurs and is completed at least once, and switchover of the third switch K3 from disconnected to connected occurs and is completed only once. In addition, in this period, the first switch K1 and the third switch K3 cannot simultaneously stay in a connected state, that is, a connection time period of the first switch does not overlap with a connection time period of the third switch.

Optionally, from a start moment from which the second clock signal is the second level signal to an end moment till which the second clock signal is the second level signal, switchover of the first clock signal from the fourth level signal to the third level signal occurs and is completed at least once, and switchover of the third clock signal from the fifth level signal to the sixth level signal occurs and is completed only once. It should be noted that, from the start moment from which the second clock signal is the second level signal to the end moment till which the second clock signal is the second level signal, that is, in a period in which the second switch K2 stays in a disconnected state, switchover of the first switch K1 from disconnected to connected occurs and is completed at least once, and switchover of the third switch K3 from connected to disconnected occurs and is completed only once. In this period, a connection time period of the first switch K1 partially overlaps with a connection time period of the third switch K3.

Optionally, the first switch K1, the second switch K2, and the third switch K3 may be all MOS transistors.

Figure 2:
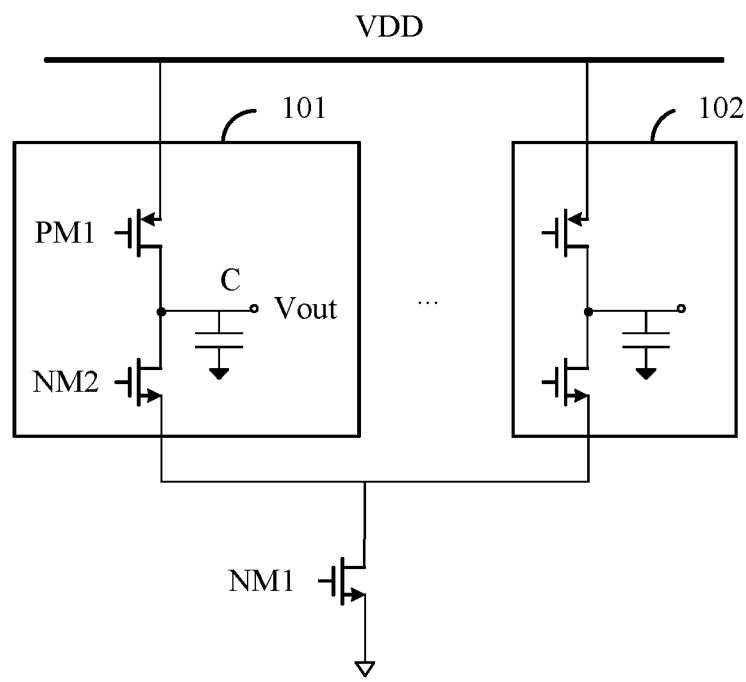
FIG. 2 is another schematic organizational structure diagram of a multi-channel clock distribution circuit according to this application.

Specifically, with reference to FIG. 2, the second switch K2 may include a first PMOS transistor PM1, the first switch K1 may include a first r NMOS transistor NM1, and the third switch K3 may include a second NMOS transistor NM2.

A source of the first PMOS transistor PM1 is connected to the power source voltage VDD, a drain of the first PMOS transistor PM1 is connected to a drain of the second NMOS transistor NM2, and a source of the second NMOS transistor NM2 is connected to a drain of the first NMOS transistor NM1. A gate of the first PMOS transistor PM1, a gate of the first NMOS transistor NM1, and a gate of the second NMOS transistor NM2 are all externally connected to a control signal generation circuit (not shown). The control signal generation circuit is configured to generate a clock signal.

As the output end $V_{out}$ of the clock distribution sub-circuit, the first end of the capacitor C is connected to the drain of the first PMOS transistor PM1 and the drain of the second NMOS transistor NM2.

Optionally, a rising edge of the output end $V_{out}$ of each clock distribution sub-circuit may be determined by a falling edge of a same clock. In this implementation, this can be implemented by just slightly transforming a circuit structure in FIG. 1. That is, one end that is of each clock distribution sub-circuit and that is connected to the power source voltage VDD in FIG. 1 is grounded instead, and each clock distribution sub-circuit grounded by using the first switch K1 is connected to the power source voltage VDD by using the first switch K1 instead. For details, refer to the implementation in FIG. 1 to facilitate understanding. Details are not described herein again.

Figure 3:
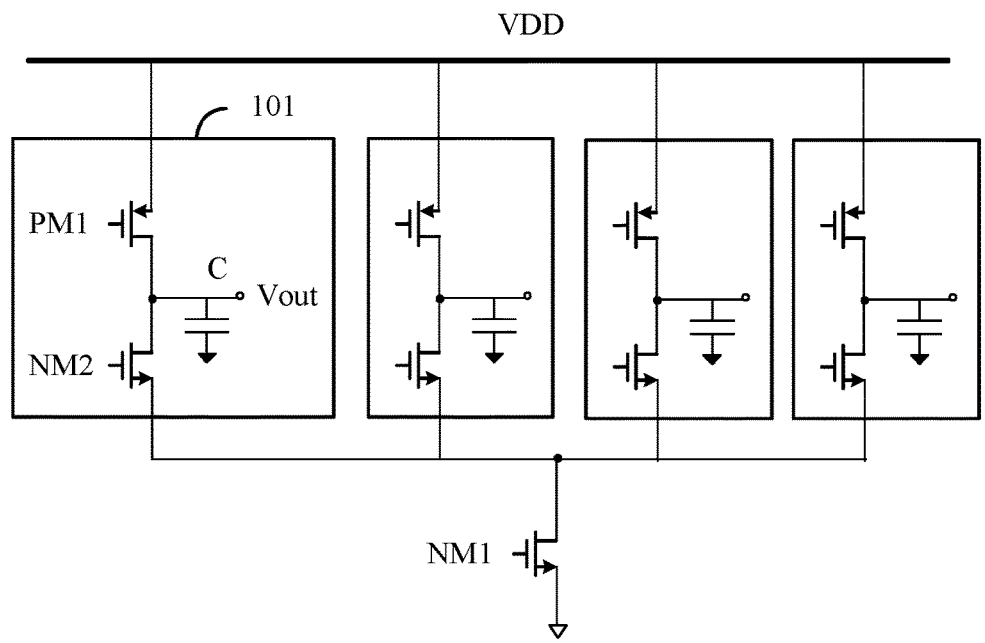
FIG. 3 is another schematic organizational structure diagram of a multi-channel clock distribution circuit according to this application.

With reference to a circuit shown in FIG. 3, the following describes a working principle of the multi-channel clock distribution circuit provided in this application.

In FIG. 3, four clock distribution sub-circuits are included. A working process of a first clock distribution sub-circuit 101 in the multi-channel clock distribution circuit is described. For other sub-circuits, refer to the descriptions herein. In a first sub-circuit in FIG. 3, a first PMOS transistor PM1 is used as a second switch K2, a first NMOS transistor NM1 is used as a first switch K1, and a second NMOS transistor NM2 is used as a third switch K3. Connection and disconnection of the PM1, the NM1, and the NM2 are controlled by a periodic clock signal. The clock signal is a square wave signal. With reference to a clock signal with timing shown in FIG. 4, a cycle of a clock signal corresponding to the NM1 is selected and used as an example herein for description. The descriptions herein do not limit a working sequence of the multi-channel clock distribution circuit.

Figure 4:
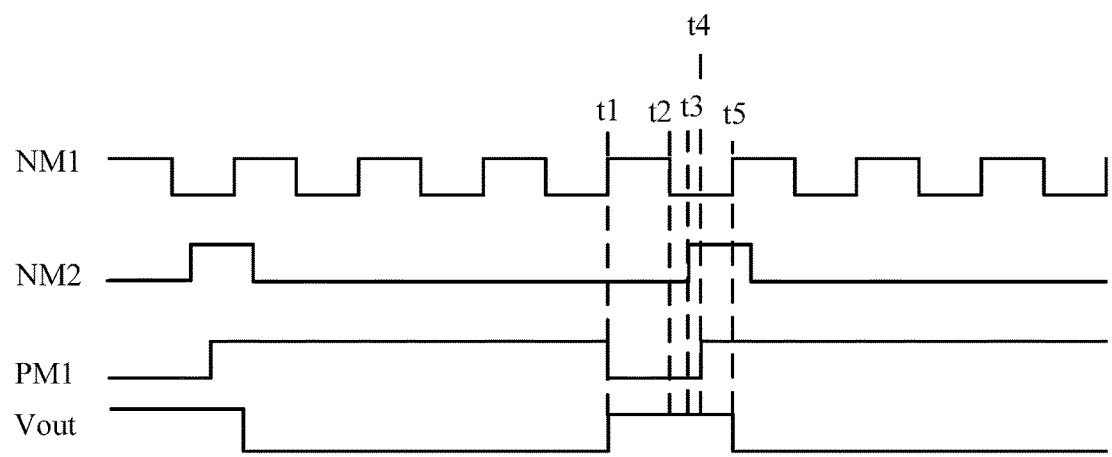
FIG. 4 is a sequence diagram of a clock control signal of a multi-channel clock distribution circuit according to this application.

In FIG. 4, a cycle of the clock signal corresponding to the NM1 is selected. The cycle is divided into five time intervals, which are respectively t1, t2, t3, t4, and t5. t1 is a start moment from which the clock signal corresponding to the NM1 is at a high level, t2 is an end moment till which the clock signal corresponding to the NM1 is at the high level, t3 is a start moment from which a clock signal corresponding to the NM2 is at the high level, t4 is an end moment till which a clock signal corresponding to the PM1 is at a low level, and t5 is an end moment till which the clock signal corresponding to the NM1 is at the low level.

In a period t1-t2, the clock signal received by the PM1 is at the low level and the PM1 stays connected, the clock signal received by the NM1 is at the high level and the NM1 stays connected, and the clock signal received by the NM2 is at the low level and the NM1 stays disconnected. Therefore, in FIG. 3, a voltage of a capacitor C, as an output end $V_{out}$ of the clock distribution sub-circuit, is pulled up to a voltage of a power source voltage VDD. In a period t2-t3, the clock signal received by the NM1 is switched from the high level to the low level, switchover from connected to disconnected occurs and is completed once, and the NM1 stays disconnected in the period t2-t3; the clock signal received by the NM2 is switched from the low level to the high level, and switchover from connected to disconnected occurs and is completed once; and the clock signal received by the PM1 is at the low level, and the PM1 stays connected. The NM1 stays disconnected and the PM1 stays connected in the period t2-t3. Therefore, the voltage of the output end $V_{out}$ is still pulled up to the voltage of the power source voltage VDD. In a period t3-t4, the clock signal received by the NM1 is at the low level and the NM1 stays disconnected, the clock signal received by the NM2 is at the high level and the NM2 stays connected, and the clock signal received by the PM1 is at the low level and the PM1 stays connected. Therefore, the voltage of the output end $V_{out}$ is still pulled up to the voltage of the power source voltage VDD. In a period t4-t5, the clock signal received by the NM1 is at the low level and the NM1 stays disconnected, the clock signal received by the NM2 is at the high level and the NM2 stays connected, and the clock signal received by the PM1 is at the high level and the PM1 stays disconnected. However, the reason why the NM2 is connected is to prepare for pulling down the voltage of the output end $V_{out}$. The clock signal corresponding to the NM1 is a clock control signal working in full speed. At the time moment t5, the PM1 stays disconnected and the NM2 stays connected, the clock signal received by the NM1 is switched from the low level to the high level, and the NM1 is connected. Therefore, the voltage of the output end $V_{out}$ is pulled down to the ground. It should be noted that, with reference to the clock signal with the timing shown in FIG. 4, a falling edge of an output end $V_{out}$ of the first clock distribution sub-circuit 101 is determined by a rising edge of the NM1. For other clock distribution sub-circuits, a falling edge of an output end $V_{out}$ of each clock distribution sub-circuit is strictly determined by the rising edge of the same NM1. In this way, the falling edges of the output end $V_{out}$ of the clock distribution sub-circuits are synchronous. This improves a clock phase matching degree between the clock distribution sub-circuits, and achieves a low clock phase mismatch between the clock distribution sub-circuits.

Optionally, the first switch K1, the second switch K2, and the third switch K3 may be all transistors.

Optionally, the first switch K1, the second switch K2, and the third switch K3 may be all CMOS transmission gates.

For an implementation that is based on transistors or CMOS transmission gates, refer to the specific implementation related to the MOS transistor in the foregoing embodiment. Details are not described herein.

This application further provides an electronic device. The electronic device includes the multi-channel clock distribution circuit in the foregoing embodiment.

Persons skilled in the art may clearly know that, for convenience and conciseness of description, in the foregoing embodiments, the embodiments emphasize different aspects, and for a part not described in detail in one embodiment, reference may be made to relevant description of another embodiment.

To make the description brief, the foregoing method embodiments are expressed as a series of actions. However, persons skilled in the art should appreciate that the disclosure is not limited to the described action sequence, because according to the disclosure, some steps may be performed in other sequences or performed simultaneously. In addition, persons skilled in the art should also appreciate that all the embodiments described in the specification are exemplary embodiments, and the related actions and modules are not necessarily mandatory to the disclosure.

In the several embodiments provided in the disclosure, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed.

The units described as separate parts may or may not be physically separate, and parts displayed as units may or may not be physical units, may be located in one position, or may be distributed on a plurality of network devices. Some or all of the devices may be selected according to actual needs to achieve the objectives of the solutions of the embodiments.

In addition, functional units in the embodiments of the disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, all of the technical solutions of the disclosure or the part of the technical solutions may be implemented in a form of a software product. The software product is stored in a storage medium, and includes several instructions for instructing a computer device (which may be a personal computer, a server, or a network device) to perform all or some of the steps of the methods described in the embodiments of the disclosure. The foregoing storage medium includes any medium that can store program code, such as a universal serial bus (USB) flash disk, a removable hard disk, a read-only memory (ROM), a random access memory (RAM), a magnetic disk, or an optical disc.

The foregoing embodiments are merely intended for describing the technical solutions of the disclosure, but not for limiting the disclosure. Although the disclosure is described in detail with reference to the foregoing embodiments, persons of ordinary skill in the art should understand that they may still make modifications to the technical solutions described in the foregoing embodiments or make equivalent replacements to some technical features thereof, without departing from the scope of the claims.

What is claimed is:

1. A multi-channel clock distribution circuit, comprising:
   a power source;
   at least two clock distribution sub-circuits electrically connected to the power source; and
   a first switch electrically connected to each of the clock distribution sub-circuits,
   wherein each clock distribution sub-circuit comprises a second switch, a third switch, and a capacitor,
   wherein a respective first end of each of the clock distribution sub-circuits is connected to the power source,
   wherein a respective second end of each of the clock distribution sub-circuits is connected to a first end of the first switch,
   wherein a second end of the first switch is grounded,
   wherein a first end of the capacitor is connected to the power source by using the second switch,
   wherein the first end of the capacitor is connected to the first end of the first switch by using the third switch,
   wherein a second end of the capacitor is grounded,
   wherein the first end of the capacitor is used as an output end of each of the clock distribution sub-circuits,
   wherein each connection of the first switch and disconnection of the first switch is controlled by a first clock signal,
   wherein each connection of the second switch and disconnection of the second switch is controlled by a second clock signal, and
   wherein each connection of the third switch and disconnection of the third switch is controlled by a third clock signal.

2. The multi-channel clock distribution circuit according to claim 1, wherein each of the first switch, the second switch, and the third switch is a metal oxide semiconductor (MOS) transistor.

3. The multi-channel clock distribution circuit according to claim 2, further comprising a control signal generation circuit, wherein the second switch comprises a first p-channel metal oxide semiconductor (PMOS) transistor, wherein the first switch comprises a first N-channel metal oxide semiconductor (NMOS) transistor, wherein the third switch comprises a second NMOS transistor, wherein a source of the first PMOS transistor is connected to the power source, wherein a drain of the first PMOS transistor is connected to a drain of the second NMOS transistor, wherein a source of the second NMOS transistor is connected to a drain of the first NMOS transistor, wherein each of a gate of the first PMOS transistor, a gate of the first NMOS transistor, and a gate of the second NMOS transistor are externally connected to the control signal generation circuit, wherein the control signal generation circuit is configured to generate a clock signal, and wherein the first end of the capacitor is connected to the drain of the first PMOS transistor and is connected to the drain of the second NMOS transistor as the output ends of the clock distribution sub-circuits.

4. The multi-channel clock distribution circuit according to claim 1, wherein each of the first switch, the second switch, and the third switch is a transistor.

5. The multi-channel clock distribution circuit according to claim 1, wherein each of the first switch, the second switch, and the third switch is a complementary metal oxide semiconductor (CMOS) transmission gate.

6. The multi-channel clock distribution circuit according to claim 1, wherein the first switch is connected when the first clock signal is a first level signal and the first switch is disconnected when the first clock signal is a second level signal.

7. The multi-channel clock distribution circuit according to claim 6, wherein each of the first switch and the third switch are not simultaneously in a connected state from a start moment to an end moment, wherein the start moment is when the second clock signal is the first level signal, and wherein the end moment is when the second clock signal is the first level signal.

8. The multi-channel clock distribution circuit according to claim 7, wherein from the start moment to the end moment, a switchover of the first clock signal from a third level signal to a fourth level signal occurs at least once.

9. The multi-channel clock distribution circuit according to claim 8, wherein from the start moment to the end moment, a switchover of the third clock signal from a sixth level signal to a fifth level signal occurs only once.

10. The multi-channel clock distribution circuit according to claim 6, wherein the second switch is connected when the second clock signal is a third level signal and the second switch is disconnected when the second clock signal is a fourth level signal.

11. The multi-channel clock distribution circuit according to claim 10, wherein the third switch is connected when the third clock signal is a fifth level signal and the third switch is disconnected when the third clock signal is a sixth level signal.

* * * * *